United States Patent
Matsui

(10) Patent No.: US 8,390,172 B2
(45) Date of Patent: Mar. 5, 2013

(54) ULTRASONIC MOTOR

(75) Inventor: Akira Matsui, Hino (JP)

(73) Assignee: Olympus Corporation, Tokyo (JP)

( * ) Notice: Subject to any disclaimer, the term of this patent is extended or adjusted under 35 U.S.C. 154(b) by 76 days.

(21) Appl. No.: 13/184,849

(22) Filed: Jul. 18, 2011

(65) Prior Publication Data

US 2012/0019103 A1   Jan. 26, 2012

(30) Foreign Application Priority Data

Jul. 20, 2010 (JP) ................... 2010-163371

(51) Int. Cl.
*H01L 41/08* (2006.01)

(52) U.S. Cl. ............... 310/323.16; 310/323.02

(58) Field of Classification Search ............ 310/323.02, 310/323.12, 323.16
See application file for complete search history.

(56) References Cited

U.S. PATENT DOCUMENTS

| | | | | |
|---|---|---|---|---|
| 5,723,935 A * | 3/1998 | Tomikawa et al. | ....... | 310/323.02 |
| 6,252,332 B1 * | 6/2001 | Takagi et al. | ........... | 310/323.02 |
| 6,469,419 B2 * | 10/2002 | Kato et al. | ............... | 310/323.02 |
| 7,555,379 B2 * | 6/2009 | Endo et al. | ....................... | 701/41 |
| 8,294,334 B2 * | 10/2012 | Takizawa et al. | ........ | 310/323.02 |
| 8,294,335 B2 * | 10/2012 | Takizawa | ................. | 310/323.16 |
| 8,299,682 B2 * | 10/2012 | Takizawa | ................. | 310/323.02 |
| 8,299,683 B2 * | 10/2012 | Takizawa | ................. | 310/323.12 |
| 8,304,962 B2 * | 11/2012 | Matsui | ..................... | 310/323.02 |

FOREIGN PATENT DOCUMENTS

JP          9-85172          3/1997

* cited by examiner

*Primary Examiner* — Mark Budd
(74) *Attorney, Agent, or Firm* — Scully Scott Murphy & Presser, PC

(57) ABSTRACT

According to one embodiment, an ultrasonic motor includes a transducer, a driven member, a pressing mechanism unit. The transducer includes stacked piezoelectric sheets on which internal electrodes are formed. The internal electrodes form driving activated areas and vibration detection activated areas in the transducer. The driving activated areas are located in portions which correspond to a node of the longitudinal vibration and an anti node of twisting vibration, so as to be symmetrical about a central plane in the stacking direction and a plane which is perpendicular to the stacking direction and includes the center axis, and are polarized in the stacking direction. The vibration detection activated areas are located in portions which correspond to a node of the longitudinal vibration and an anti node of the twisting vibration and are closer to the central plane than the driving activated areas, and are polarized in the stacking direction.

4 Claims, 9 Drawing Sheets

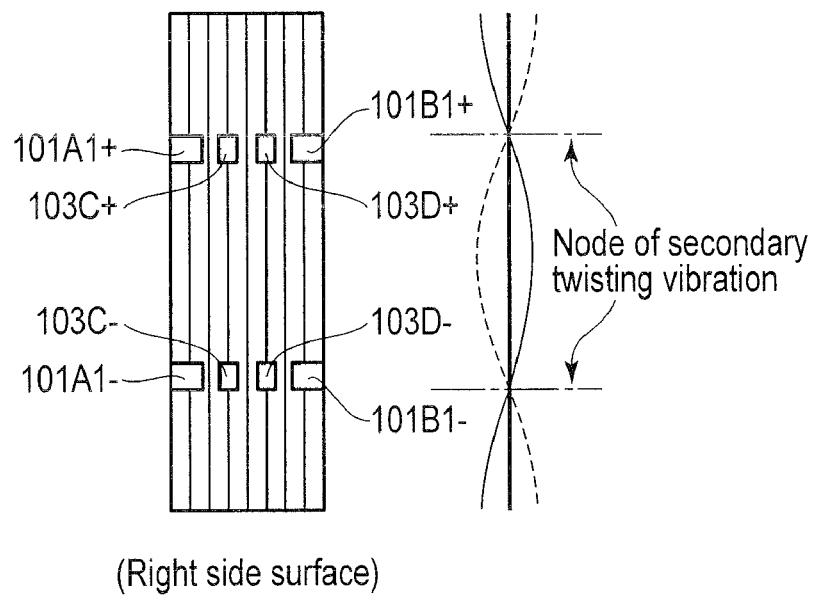
(Right side surface)
F I G. 7A
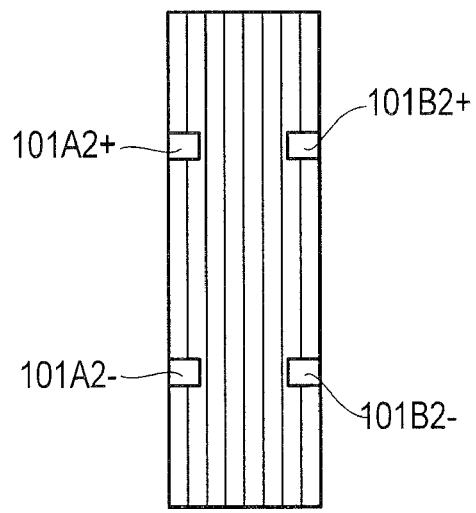
(Left side surface)
F I G. 7B

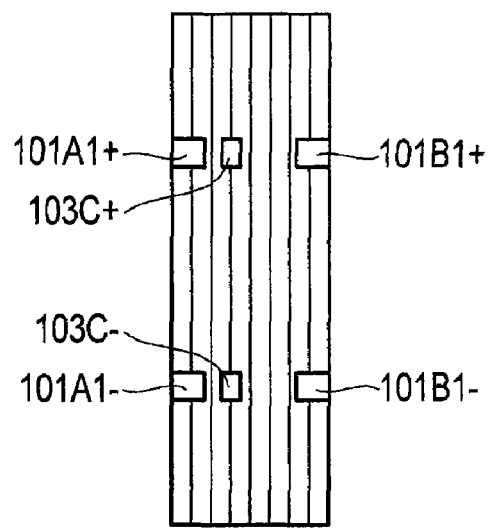
(Right side surface)
F I G. 11A
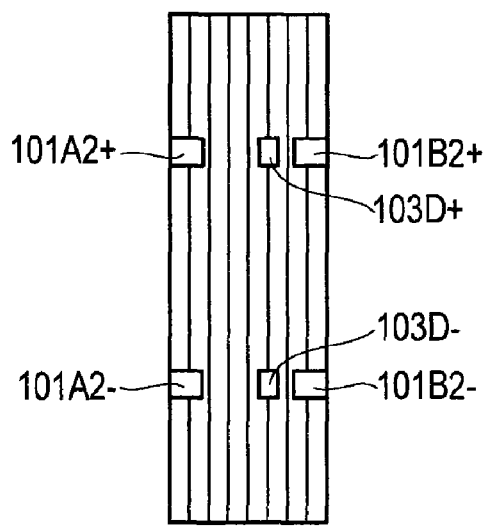
(Left side surface)
F I G. 11B

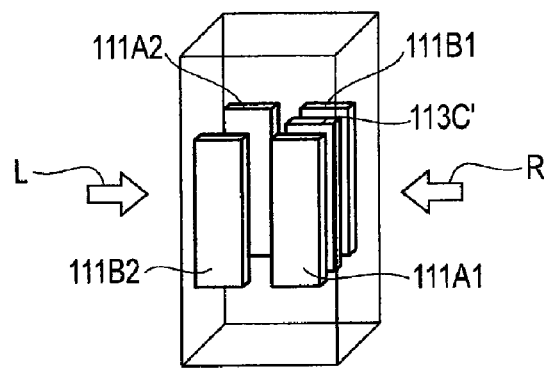
F I G. 13
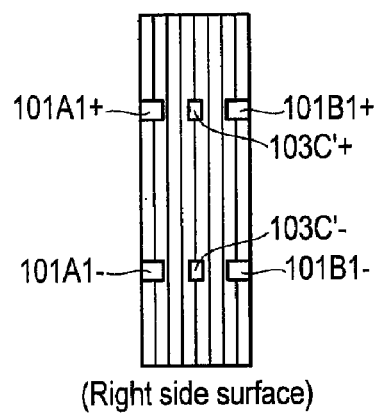
(Right side surface)
F I G. 14A
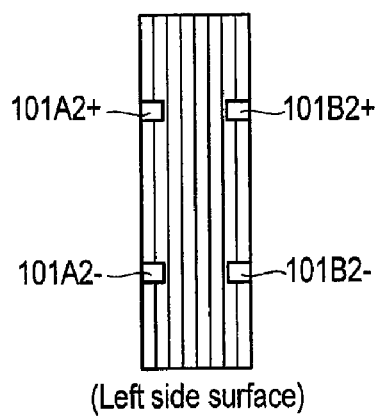
(Left side surface)
F I G. 14B

ULTRASONIC MOTOR

CROSS-REFERENCE TO RELATED APPLICATIONS

This application is based upon and claims the benefit of priority from prior Japanese Patent Application No. 2010-163371, filed Jul. 20, 2010, the entire contents of which are incorporated herein by reference.

BACKGROUND OF THE INVENTION

1. Field of the Invention

The present invention relates to an ultrasonic motor using, for example, a transducer such as a piezoelectric element.

2. Description of the Related Art

Recently, attention has been paid to an ultrasonic motor using the vibration of a transducer such as a piezoelectric element as a new motor replacing an electromagnetic type motor. This ultrasonic motor is superior to a conventional electromagnetic type motor in being capable of obtaining low-speed high thrust without gears, having high holding force, having high resolution, being low noise, producing no magnetic noise, and the like.

More specifically, for example, in this motor, a transducer body formed from an ultrasonic transducer is pressed against a rotor as a driven member through a driving element to generate a frictional force between the driving element and the rotor, thereby driving the rotor with the frictional force.

More specifically, simultaneously generating longitudinal vibration and twisting vibration in the ultrasonic transducer will generate elliptic vibration by combining the vibrations in an end face of the ultrasonic transducer, thereby rotating the rotor by using the elliptic vibration. As a technique associated with this ultrasonic motor, for example, the following technique is disclosed in, for example, Jpn. Pat. Appln. KOKAI Publication No. 9-85172.

That is, Jpn. Pat. Appln. KOKAI Publication No. 9-85172 discloses an ultrasonic motor including a rod-like elastic body, a plurality of holding elastic bodies provided on a side surface of the rod-like elastic body so as to be integrated with the rod-like elastic body, a plurality of multilayer piezoelectric elements each having two ends held by the plurality of holding elastic bodies, a plurality of vibration detection piezoelectric elements provided between the multilayer piezoelectric elements and the holding elastic bodies, a friction element provided on an end face of the rod-like elastic body, a rotor which is placed while being pressed against the friction element by a pressing means, and a power supply means for applying, to each of the plurality of pairs of multilayer piezoelectric elements, alternating voltages having a phase difference, which have a predetermined frequency and magnitude (amplitude) corresponding to the phase or amplitude of a signal output from the vibration detection piezoelectric elements.

This motor includes the plurality of pairs of multilayer piezoelectric elements. More specifically, the displacing direction of each of the multilayer piezoelectric elements and the longitudinal direction of the rod-like elastic body define a predetermined acute angle, and each pair of the multilayer piezoelectric elements tilt in opposite directions.

The ultrasonic motor disclosed in Jpn. Pat. Appln. KOKAI Publication No. 9-85172 excites elliptic vibration by simultaneously exciting longitudinal vibration and twisting vibration in the rod-like elastic body, thereby driving to rotate the rotor using the friction element.

More specifically, according to the technique disclosed in Jpn. Pat. Appln. KOKAI Publication No. 9-85172, one pair or a plurality of pairs of multilayer piezoelectric elements are held between the rod-like elastic body having concave portions in which the multiplayer piezoelectric elements can be inserted and the holding elastic bodies. The holding elastic bodies are fixed to the rod-like elastic body with screws while they are abutted on the multilayer piezoelectric elements to apply compressive stress to them.

When, therefore, the structure disclosed in Jpn. Pat. Appln. KOKAI Publication No. 9-85172 is to be used, holding elastic bodies for fixing piezoelectric elements become essential constituent elements, and it is necessary to form concave portions in a rod-like elastic body to accommodate the holding elastic bodies and the piezoelectric elements. It is therefore difficult to simplify and reduce the size of the structure of a transducer body by using the technique disclosed in Jpn. Pat. Appln. KOKAI Publication No. 9-85172.

BRIEF SUMMARY OF THE INVENTION

The present invention has been made in consideration of the above situations, and has as its object to provide an ultrasonic motor with a simple arrangement.

To achieve the above object, according to an aspect of the present invention, there is provided an ultrasonic motor comprising:

a transducer in which a ratio between lengths of a short side and long side, constituting a section perpendicular to a center axis of the transducer having a substantially rectangular shape, is set to a ratio which makes a resonance frequency of longitudinal vibration of the transducer stretching and contracting in the center axis direction substantially coincide with a resonance frequency of twisting vibration about the center axis as a twisting axis, the longitudinal vibration and the twisting vibration are simultaneously excited, and elliptic vibration obtained by combining the vibrations is excited;

a driven member which is pressed against an elliptic vibration generation surface, of the transducer, in which the elliptic vibration is excited, and is driven to rotate about the center axis as a rotation axis by the elliptic vibration; and a pressing mechanism unit which presses the transducer against the driven member to press the elliptic vibration generation surface of the transducer against the driven member, wherein the transducer includes a plurality of stacked piezoelectric sheets on which internal electrodes are formed, the internal electrodes form a plurality of driving activated areas and a plurality of vibration detection activated areas in the transducer, the plurality of driving activated areas are located in portions, of the transducer, which correspond to a node of the longitudinal vibration and an anti-node of twisting vibration, so as to be symmetrical about a central plane in the stacking direction and a plane which is perpendicular to the stacking direction and includes the center axis, and are polarized in the stacking direction, and the plurality of vibration detection activated areas are located in portions, of the transducer, which correspond to a node of the longitudinal vibration and an anti-node of the twisting vibration and are closer to the central plane than the driving activated areas, and are polarized in the stacking direction.

Advantages of the invention will be set forth in the description which follows, and in part will be obvious from the description, or may be learned by practice of the invention.

The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 7A is a view showing an example of the arrangement of the multilayer piezoelectric element (the right side surface) viewed from the direction indicated by an arrow R in FIG. 5;

FIG. 7B is a view showing an example of the arrangement of the multilayer piezoelectric element (the left side surface) viewed from the direction indicated by an arrow L in FIG. 5;

FIG. 11A is a view showing an example of the arrangement of the multilayer piezoelectric element (the right side surface) viewed from the direction indicated by an arrow R in FIG. 10;

FIG. 11B is a view showing an example of the arrangement of the multilayer piezoelectric element (the left side surface) viewed from the direction indicated by an arrow L in FIG. 10;

FIG. 13 is a perspective view showing the multilayer piezoelectric element of the ultrasonic motor according to the third embodiment when viewed from the front upper side;

FIG. 14A is a view showing an example of the arrangement of the multilayer piezoelectric element (the right side surface) viewed from the direction indicated by an arrow R in FIG. 13; and FIG. 14B is a view showing an example of the arrangement of the multilayer piezoelectric element (the left side surface) viewed from the direction indicated by an arrow L in FIG. 13.

DETAILED DESCRIPTION OF THE INVENTION

The embodiments of the present invention will be described below with reference to the views of the accompanying drawing.

First Embodiment

Figure 1:
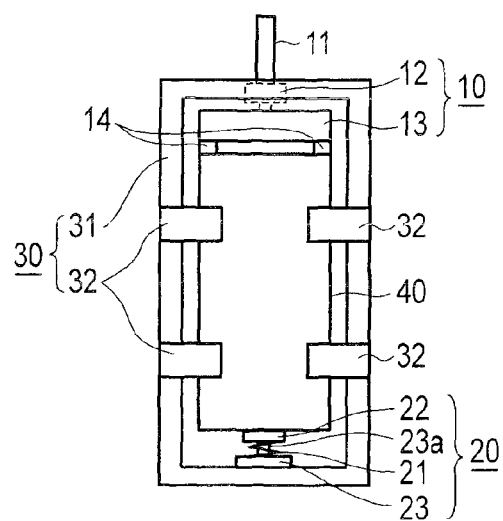
FIG. 1 is a front view showing an example of the arrangement of an ultrasonic motor according to the first embodiment of the present invention.

FIG. 1 is a front view showing an example of the arrangement of an ultrasonic motor according to the first embodiment of the present invention. As shown in FIG. 1, the ultrasonic motor according to the first embodiment includes a rotor mechanism portion 10, a pressing mechanism portion 20, a housing portion 30, and a multilayer piezoelectric element 40.

The rotor mechanism portion 10 includes a rotating shaft 11, a bearing 12, and a rotor 13.

The rotating shaft 11 is a shaft member coupled to the central portion of the rotor 13. Note that the respective constituent members of the rotor mechanism portion 10 are concentrically arranged relative to the rotating shaft 11.

The bearing 12 is a bearing member which is fixed to a frame 31 of the housing portion 30 (to be described later), and through which the rotating shaft 11 extends.

The rotor 13 is in contact with friction elements 14 provided on the upper surface of the multilayer piezoelectric element 40. At the central portion, the rotor 13 is coupled to the rotating shaft 11 which is inserted into the bearing 12 fixed to the frame 31. The rotor 13 is a driven member which is slid by the friction elements 14 using elliptic vibration excited in the upper surface of the multilayer piezoelectric element 40 as a driving source, and rotates about the rotating shaft 11.

The pressing mechanism portion 20 includes a pressing spring 21, a pressing member 22, and a fixed plate 23 provided with a spring restricting member 23a.

The pressing spring 21 is a spring member for pressing the multilayer piezoelectric element 40 (to be described later) against the rotor 13. More specifically, the pressing spring 21 is, for example, a leaf spring or coil spring.

The pressing member 22 is provided on nearly the central portion of the bottom surface (the surface facing the pressing mechanism portion 20) of the multilayer piezoelectric element 40. The pressing force of the pressing spring 21 is transferred to the multilayer piezoelectric element 40 through the pressing member 22.

The fixed plate 23 is fixed to the frame 31 (to be described later), and is provided with the spring restricting member 23a which is a projection portion for positioning the pressing spring 21. The spring restricting member 23a extends through the pressing spring 21 to position the pressing spring 21.

The housing portion 30 includes the frame 31 and support members 32.

The frame 31 is a frame member having a nearly rectangular outer shape, which holds the multilayer piezoelectric element 40, together with the pressing mechanism portion 20 and the support members 32.

The support member 32 includes support members 32a and 32b which are provided on the frame 31 so as to face each other and clamp the multilayer piezoelectric element 40 from the two side surfaces of the frame 31. The support members 32 are provided at a position corresponding to nodes of the secondary twisting vibration excited in the multilayer piezoelectric element 40.

The multilayer piezoelectric element 40 has the arrangement described later, and has the friction elements 14 provided on its upper end face (the face facing the rotor mechanism portion 10) so as to be in contact with the rotor 13.

Figure 2:
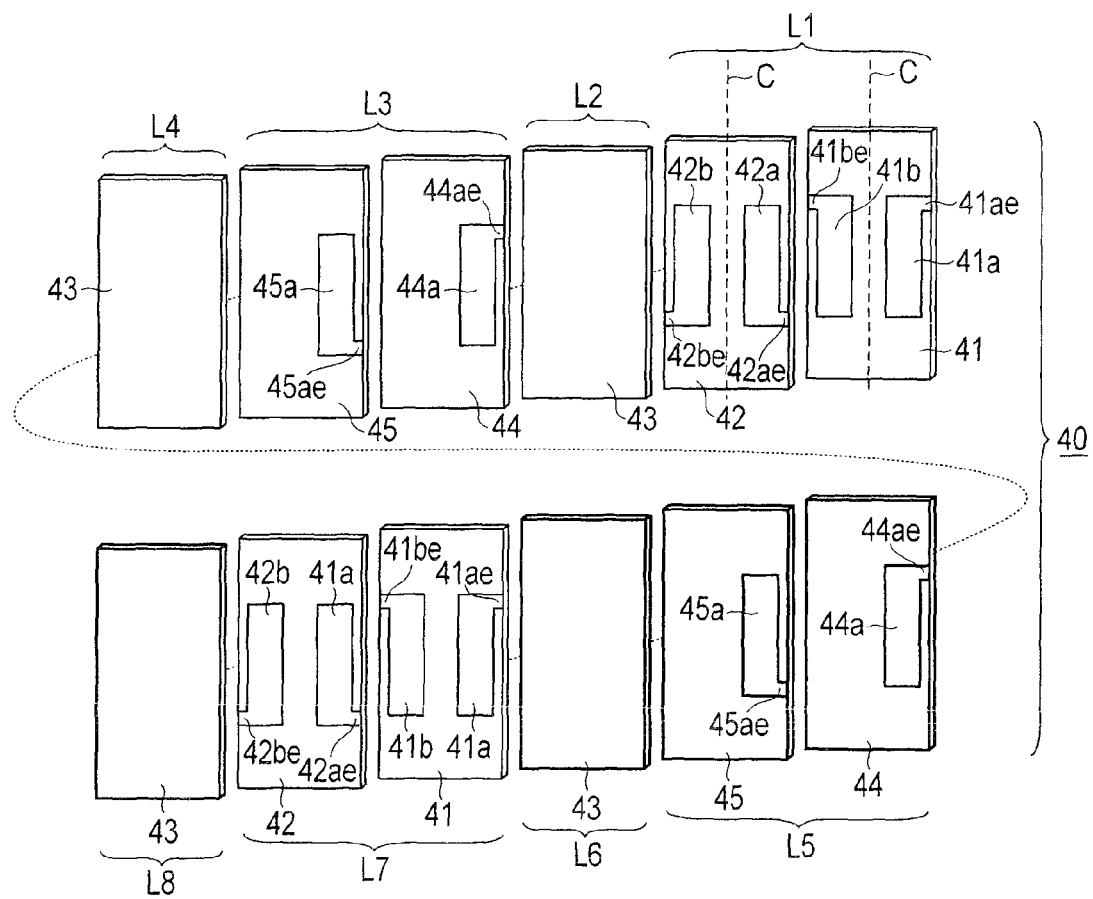
FIG. 2 is a view showing an example of the arrangement of a multilayer piezoelectric element.

FIG. 2 is a view showing an example of the arrangement of the multilayer piezoelectric element 40. The multilayer piezoelectric element 40 is formed by stacking five types of piezoelectric sheets (a first piezoelectric sheet 41, a second piezoelectric sheet 42, a third piezoelectric sheet 43, a fourth piezoelectric sheet 44, and a fifth piezoelectric sheet 45; the detailed arrangement of each piezoelectric sheet will be described later) in the following manner.

<<First Multilayer Region L1>>

A first multilayer region L1 is formed by alternately stacking the plurality of first and second piezoelectric sheets 41 and 42 on each other in the thickness direction.

<<Second Multilayer Region L2>>

A second multilayer region L2 is formed by stacking at least one third piezoelectric sheet 43 on the first multilayer region L1.

<<Third Multilayer Region L3>>

A third multilayer region L3 is formed by alternately stacking the plurality of fourth and fifth piezoelectric sheets 44 and 45 on the second multilayer region L2.

<<Fourth Multilayer Region L4>>

A fourth multilayer region L4 is formed by stacking at least one third piezoelectric sheet 43 on the third multilayer region L3. The fourth multilayer region includes a center axis 100C as the rotation center axis of the multilayer piezoelectric element 40.

<<Fifth Multilayer Region L5>>

A fifth multilayer region L5 is formed by alternately stacking the plurality of fourth and fifth piezoelectric sheets 44 and 45 on the fourth multilayer region L4.

<<Sixth Multilayer Region L6>>

A sixth multilayer region L6 is formed by stacking at least one third piezoelectric sheet 43 on the fifth multilayer region L5.

<<Seventh Multilayer Region L7>>

A seventh multilayer region L7 is formed by alternately stacking the plurality of first and second piezoelectric sheets 41 and 42 on the sixth multilayer region L6.

<<Eighth Multilayer Region L8>>

An eighth multilayer region L8 is formed by stacking at least one third piezoelectric sheet 43 on the seventh multilayer region L7.

Figure 3:
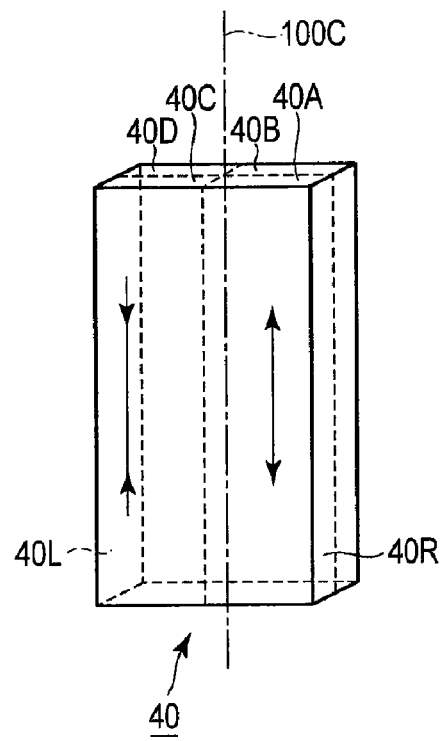
FIG. 3 is a view showing four areas constituting the multilayer piezoelectric element.

As shown in FIG. 3, the multilayer piezoelectric element 40 includes four areas 40A, 40B, 40C, and 40D obtained by dividing the multilayer piezoelectric element 40 at 90° intervals around the center axis 100C within a plane perpendicular to the center axis 100C.

The first to third multilayer regions L1 to L3 respectively correspond to the areas 40B and 40D (the areas shown on the rear side in FIG. 3). The fifth to seventh multilayer regions L5 to L7 respectively correspond to the areas 40A and 40C (the areas shown on the front side in FIG. 3). Note that the fourth multilayer region L4 belongs to the areas 40B and 40D (the areas shown on the rear side in FIG. 3) or belongs to the areas 40A and 40C (the areas shown on the front side in FIG. 3).

The arrangement of each of the above piezoelectric sheets will be described below.

The first piezoelectric sheet 41, second piezoelectric sheet 42, third piezoelectric sheet 43, fourth piezoelectric sheet 44, and fifth piezoelectric sheet 45 described above each are a rectangular sheet-like piezoelectric element formed from a hard lead zirconate titanate piezoelectric ceramic element (PZT).

Although described in detail later, the first piezoelectric sheet 41, second piezoelectric sheet 42, third piezoelectric sheet 43, and fourth piezoelectric sheet 44 are provided with internal electrodes. Each of these internal electrodes is made of, for example, a silver palladium alloy having a thickness of 4 μm. After the piezoelectric sheets are stacked one upon another, a high voltage is applied to the electrodes. By so doing, the piezoelectric sheets between the electrodes are polarized in the thickness direction thereof, thereby forming an activated piezoelectric area.

As shown in FIG. 2, internal electrodes 41a and 41b are provided on the electrode formation surface of the first piezoelectric sheet 41 so as to be symmetrical about a center line C (a line dividing a short side into two equal parts). The positions of the internal electrodes 41a and 41b provided on the electrode formation surface of the first piezoelectric sheet 41 will be described in detail below.

Figure 4A:
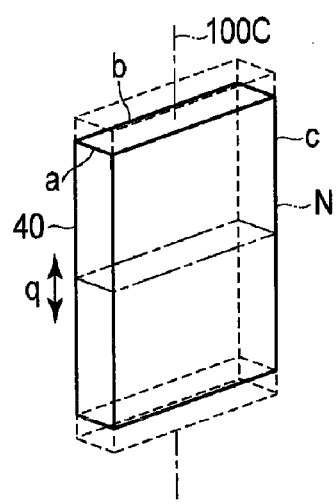
FIG. 4A is a view showing how primary longitudinal vibration occurs in the multilayer piezoelectric element.
Figure 4B:
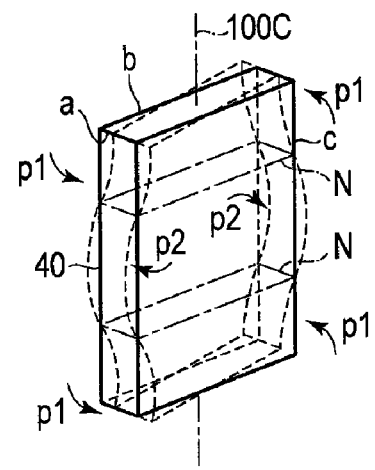
FIG. 4B is a view showing how secondary twisting vibration occurs in the multilayer piezoelectric element.

FIG. 4A is a view showing how primary longitudinal vibration occurs in the multilayer piezoelectric element 40. FIG. 4B is a view showing how secondary twisting vibration occurs in the multilayer piezoelectric 40. Referring to FIGS. 4A and 4B, the shape of the multilayer piezoelectric element 40 before vibration is indicated by the solid lines, and the shape of the multilayer piezoelectric element 40 after vibration is indicated by the broken lines. Reference symbols p1 and p2 denote twisting vibration directions; q, a longitudinal vibration direction; and N, a node of vibration.

As shown in FIGS. 4A and 4B, one node N exists at a central position in the height direction in primary longitudinal vibration, and the nodes N exist at two positions in the height direction in secondary twisting vibration. As shown in FIGS. 2, 4A, and 4B, the internal electrodes 41a and 41b are provided on the electrode formation surface of the first piezoelectric sheet 41 at positions corresponding to a node of primary longitudinal vibration and an anti-node of secondary twisting vibration excited in the multilayer piezoelectric element 40.

As shown in FIG. 2, the internal electrode 41a is provided with an exposed portion 41ae extending toward an edge portion of one long side of the first piezoelectric sheet 41. The internal electrode 41b is provided with an exposed portion 41be extending toward an edge portion of the other long side of the first piezoelectric sheet 41.

Internal electrodes 42a and 42b are provided on the electrode formation surface of the second piezoelectric sheet 42 at positions respectively corresponding to the stacked internal electrodes 41a and 41b. The internal electrodes 42a and 42b are respectively provided with exposed portions 42ae and 42be extending to the sides (which overlap those of the other piezoelectric sheet when the sheets are stacked) corresponding to the sides of the internal electrodes 41a and 41b to which the exposed portions 42ae and 42be extend.

In this case, the exposed portions 41ae and 42ae are shifted from each other by a predetermined distance so as not to overlap each other when the sheets are stacked. Likewise, the exposed portions 41be and 42be are shifted from each other by a predetermined distance so as not to overlap each other when the sheets are stacked.

The third piezoelectric sheet 43 is a piezoelectric sheet provided with no internal electrode. The third piezoelectric sheet 43 is a piezoelectric sheet for electric insulation.

An internal electrode 44a is provided on the electrode formation surface of the fourth piezoelectric sheet 44 at a position corresponding to the internal electrodes 41a and 42a when the sheets are stacked.

The internal electrode 44a is provided with an exposed portion 44ae extending to a side (which overlaps the sides of the other piezoelectric sheets when the sheets are stacked) corresponding to the sides to which the exposed portions 41ae and 42ae of the internal electrodes 41a and 42a extend. In this case, the exposed portions 44*ae* and 41*ae* are provided at positions where they overlap when the sheets are stacked.

An internal electrode 45*a* is provided on the electrode formation surface of the fifth piezoelectric sheet 45 at a position corresponding to the internal electrodes 41*a* and 42*a* when the sheets are stacked. The internal electrode 45*a* is provided with an exposed portion 45*ae* extending to a side (which overlaps the sides of the other piezoelectric sheets when the sheets are stacked) corresponding to the sides to which the exposed portions 41*ae* and 42*ae* of the internal electrodes 41*a* and 42*a* extend. In this case, the exposed portions 45*ae* and 42*ae* are provided at positions where they overlap when the sheets are stacked.

The arrangement of the electrodes in the respective areas of the multilayer piezoelectric element 40 will be described below.

Figure 5:
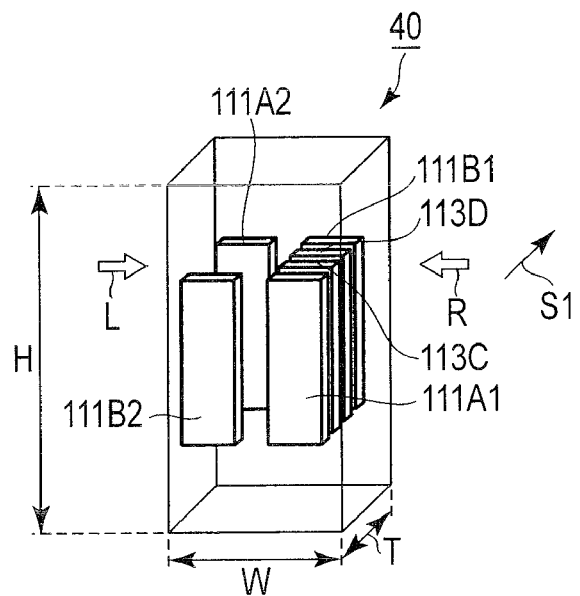
FIG. 5 is a perspective view of the multilayer piezoelectric element, visualizing and showing a driving activated areas and vibration detection activated areas existing in the multilayer piezoelectric element.

FIG. 5 is a perspective view of the multilayer piezoelectric element 40 viewed from the front upper side. For the sake of descriptive convenience, FIG. 5 visualizes and shows the driving activated areas and vibration detection activated areas (formed by the above internal electrodes) existing in the multilayer piezoelectric element 40, and also shows the respective piezoelectric sheets integrally as the multilayer piezoelectric element 40 instead of discretely showing them.

In an area A of the multilayer piezoelectric element 40, the region formed by stacking the internal electrodes 41*a* and 42*a* is a driving activated area (A1 phase) 111A1. The region formed by stacking the internal electrodes 44*a* and 45*a* is a vibration detection activated area (C phase) 113C.

In an area B of the multilayer piezoelectric element 40, the region formed by stacking the internal electrodes 41*a* and 42*a* is a driving activated area (B1 phase) 111B1. The region formed by stacking the internal electrodes 44*a* and 45*a* is a vibration detection activated area (D phase) 113D.

In an area C of the multilayer piezoelectric element 40, the region formed by stacking the internal electrodes 41*b* and 42*b* is a driving activated area (B2 phase) 111B2.

In an area D of the multilayer piezoelectric element 40, the region formed by stacking the internal electrodes 41*b* and 42*b* is a driving activated area (A2 phase) 111A2.

More specifically, the positions of the driving activated areas 111A1, 111A2, 111B1, and 111B2 described above in the multilayer piezoelectric element 40 correspond to a node of primary longitudinal vibration and an anti-node of secondary twisting vibration excited in the multilayer piezoelectric element 40, and also correspond to the surface layer regions of the multilayer piezoelectric element 40. These positions are positions where vibration (twisting vibration in particular) can be most efficiently excited in the multilayer piezoelectric element 40.

The positions of the vibration detection activated areas 113C and 113D described above in the multilayer piezoelectric element 40 are located more inwardly than the driving activated areas 111A1, 111A2, 111B1, and 111B2 in the multilayer piezoelectric element 40, and correspond to a node of primary longitudinal vibration and an anti-node of secondary twisting vibration.

In the first embodiment, the vibration detection activated areas 113C and 113D are arranged to be symmetrical about the third piezoelectric sheet 43 placed at an intermediate region in the stacking direction of the piezoelectric sheets. This makes it possible to perform vibration detection (to be described later).

Figure 6:
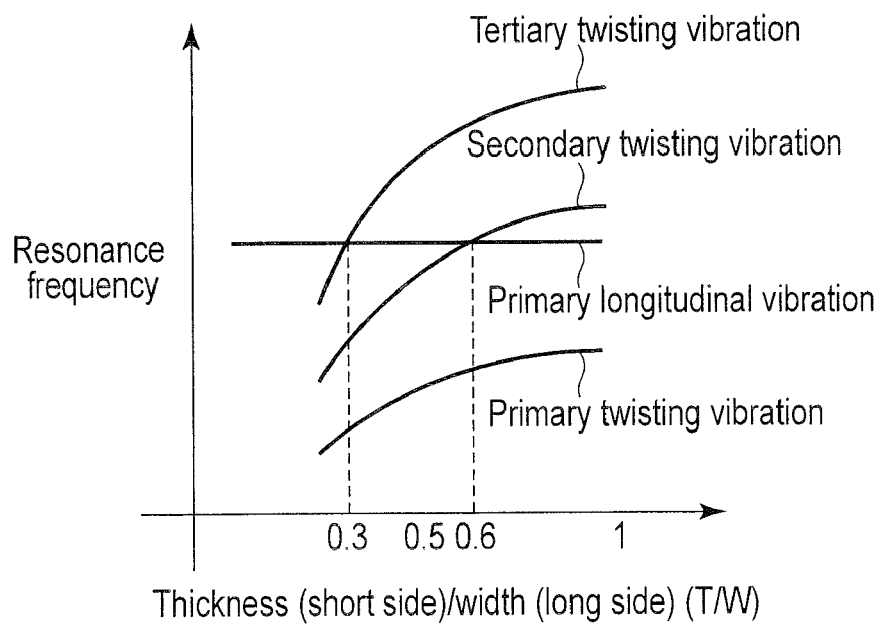
FIG. 6 is a graph showing the characteristics of the multilayer piezoelectric element.

As shown in FIG. 5, reference symbols H, T, and W respectively denote the height, thickness, and width of the multilayer piezoelectric element 40. Assume that the abscissa represents the value of (thickness (short side) T/width (long side) W), and the ordinate represents the resonance frequencies in the respective vibration modes, while the height H is kept constant. In this case, the characteristics shown in FIG. 6 can be obtained. More specifically, the following characteristics are obtained:

The resonance frequency in primary longitudinal vibration does not depend on the value of (T/W), and takes an almost constant value.

The resonance frequencies in the primary twisting vibration mode, secondary twisting vibration mode, and tertiary twisting vibration mode increase with an increase in the value of (T/W).

The resonance frequency in the primary twisting vibration mode does not coincide with the resonance frequency in the primary longitudinal vibration mode regardless of the value of (T/W).

The resonance frequency in the secondary twisting vibration mode coincides with the resonance frequency in primary longitudinal vibration mode when the value (T/W) becomes near 0.6.

The resonance frequency in the tertiary twisting vibration mode coincides with the resonance frequency in the primary longitudinal vibration mode when the value (T/W) becomes near 0.3.

The ultrasonic motor according to the first embodiment uses the primary longitudinal vibration mode and the secondary twisting vibration mode. Therefore, the thickness T and width W of the multilayer piezoelectric element 40 are set to make the value of (T/W) become nearly 0.6. Designing the multilayer piezoelectric element 40 in this manner can make the resonance frequency in the primary longitudinal vibration mode almost coincide with the resonance frequency in the secondary twisting vibration mode.

FIG. 7A is a view showing an example of the arrangement of the multilayer piezoelectric element 40 (the right side surface) viewed from the direction indicated by an arrow R in FIG. 5. FIG. 7B is a view showing an example of the arrangement of the multilayer piezoelectric element 40 (the left side surface) viewed from the direction indicated by the arrow L in FIG. 5. The respective internal electrodes described above are short-circuited by external electrodes in the following manner.

<<Area A>>

The exposed portions 41*ae* of the internal electrodes 41*a* are short-circuited through an external electrode (A1+ phase) 101A1+.

The exposed portions 42*ae* of the internal electrodes 42*a* are short-circuited through an external electrode (A1− phase) 101A1−.

The exposed portions 44*ae* of the internal electrodes 44*a* are short-circuited through an external electrode (C+ phase) 103C+.

The exposed portions 45*ae* of the internal electrodes 45*a* are short-circuited through an external electrode (C− phase) 103C−.

<<Area B>>

The exposed portions 41*ae* of the internal electrodes 41*a* are short-circuited through an external electrode (B1+ phase) 101B1+.

The exposed portions 42*ae* of the internal electrodes 42*a* are short-circuited through an external electrode (B1− phase) 101B1−.

The exposed portions 44*ae* of the internal electrodes 44*a* are short-circuited through an external electrode (D+ phase) 103D+.

The exposed portions 45ae of the internal electrodes 45a are short-circuited through an external electrode (D− phase) 103D−.

<<Area C>>

The exposed portions 41be of the internal electrodes 41b are short-circuited through an external electrode (B2+ phase) 101B2+.

The exposed portions 42be of the internal electrodes 42b are short-circuited through an external electrode (B2− phase) 101B2−.

<<Area D>>

The exposed portions 41be of the internal electrodes 41b are short-circuited through an external electrode (A2+ phase) 101A2+.

The exposed portions 42be of the internal electrodes 42b are short-circuited through an external electrode (A2− phase) 101A2−.

The operation of the ultrasonic motor according to the first embodiment will be described below.

Figure 8A:
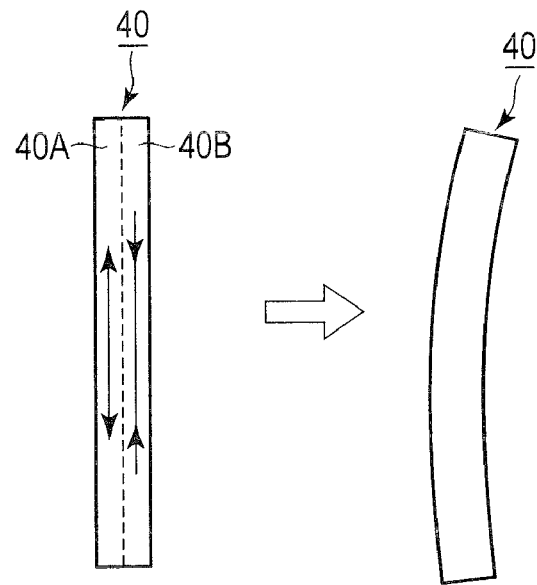
FIG. 8A is a left side view showing a modification of the multilayer piezoelectric element.
Figure 8B:
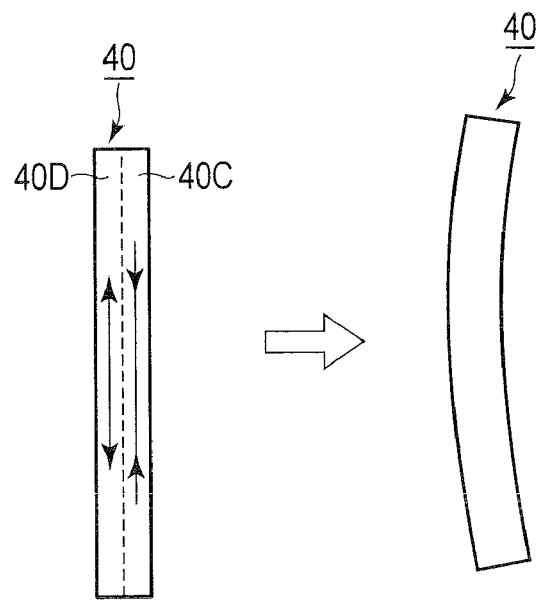
FIG. 8B is a right side view showing a modification of a multilayer piezoelectric element 40.

FIG. 8A is a right side view schematically showing a transducer 40 according to one modification. FIG. 8B is a left side view schematically showing the transducer 40 according to the modification. It should be noted that FIGS. 8A and 8B are schematic views and hence omit an illustration of members such as external electrodes, as needed.

A description will be given of a method used for driving the ultrasonic motor of the embodiment.

An AC voltage having a frequency corresponding to the resonance frequency of either the primary longitudinal vibration or the secondary twisting vibration is applied between the external electrode (A1+ phase) 101A1+ and the external electrode (A1− phase) 101A1−, and between the external electrode (A2+ phase) 101A2+ and the external electrode (A2− phase) 101A2−.

On the other hand, an inverted AC voltage having a phase difference of 180° relative to the AC voltage applied to the external electrodes of the A1 phase and A2 phase and having a frequency corresponding to the resonance frequency of either the primary longitudinal vibration or the secondary twisting vibration is applied between the external electrode (B1+ phase) 101B1+ and the external electrode (B1− phase) 101B1−, and between the external electrode (B2+ phase) 101B2+ and the external electrode (B2− phase) 101B2−.

At the time, the transducer 40 operates as follows. The areas (area 40A and area 40B) of the multilayer piezoelectric element 40 that include driving activated areas 111A1 and 111B1 of the A1 phase and B1 phase expand or contract in the longitudinal direction of the transducer 40. The AC voltage applied to the driving activated area 111A1 of the A1 phase and the AC voltage applied to the driving activated area 111B1 of the B1 phase are 180° out of phase. Therefore, when the driving activated area 111A1 of the A1 phase expands, the driving activated area 111B1 of the B1 phase contracts. Conversely, when the driving activated area 111A1 of the A1 phase contracts, the driving activated area 111B1 of the B1 phase expands. As a result of this, the area expansion and contraction occur in opposite directions between the obverse and reverse sides of the transducer 40 (i.e., between the closer side and the farther side of the transducer 40 as viewed in FIG. 3). The expansion and contraction cause the transducer 40 to bend in the longitudinal direction.

The driving activated areas 111A2 and 111B2 of the A2 phase and B2 phase operate in a similar manner to that of the driving activated areas 111A1 and 111B1 of the A1 phase and B1 phase, and cause the transducer 40 to bend in the longitudinal direction. Area 40A including the driving activated area 111A1 of the A1 phase is located on the obverse side of the transducer 40 (i.e., the closer side of the transducer 40 as viewed in FIG. 3), area 40D including the driving activated area 111A2 of the A2 phase is located on the reverse side (i.e., the farther side of the transducer 40 as viewed in FIG. 3), area 40B including the driving activated area 111B1 of the B1 phase is located on the reverse side of the transducer 40 (i.e., the farther side of the transducer 40 as viewed in FIG. 3, and area 40C including the driving activated area 111B2 of the B2 phase is located on the obverse side (i.e., the closer side of the transducer 40 as viewed in FIG. 3).

Accordingly, the bending deformation caused by both the driving activated area 111A1 of the A1 phase and the driving activated area 111B1 of the B1 phase and the bending deformation caused by both the driving activated area 111A2 of the A2 phase and the driving activated area 111B2 of the B2 phase are opposite in terms of their bending directions.

As a result, the bending occurs in opposite directions between one side of the central axis of the transducer 40 and the other side of the central axis of the transducer 40 (see FIGS. 8A and 8B). Accordingly, the secondary twisting vibration of the transducer 40 is caused, with the central axis as a center. Potentials of different polarities are generated in areas corresponding to the vibration detection activated areas 113C and 113D of the multilayer piezoelectric element 40 (the C and D phases are vibration detection phases).

Then, an AC voltage having a frequency corresponding to the resonance frequency of either the primary longitudinal vibration or secondary twisting vibration is applied between the external electrode (A1+ phase) 101A1+ and the external electrode (A1− phase) 101A1−, between the external electrode (A2+ phase) 101A2+ and the external electrode (A2− phase) 101A2−, between the external electrode (B1+ phase) 101B1+ and the external electrode (B1− phase) 101B1−, and between the external electrode (B2+ phase) 101B2+ and the external electrode (B2− phase) 101B2−. At the time, the areas of the multilayer piezoelectric element 40 that include the driving activated areas of the A1 phase, A2 phase, B1 phase and B2 phase, namely, areas 40A, 40D, 40B and 40C, vibrate in phase, as a result of which the primary longitudinal vibration of the multilayer piezoelectric element 40 occurs. At the time, the same potential is generated in areas corresponding to the vibration detection activated areas 113C and 113D of the multilayer piezoelectric element 40 (the C and D phases are vibration detection phases).

When AC voltages having different phases (e.g., a phase difference of 90° are applied to the A1 phase and A2 phase of the multilayer piezoelectric element 40 having the above characteristics and to the B1 phase and B2 phase thereof, primary longitudinal vibration and secondary twisting vibration are simultaneously excited in the multilayer piezoelectric element 40, generating elliptic vibration in the upper end face of the multilayer piezoelectric element 40. This causes the friction elements 14 to rotate the rotor 13 pressed and held on the multilayer piezoelectric element 40.

When the phase difference of AC voltages to be applied to the A1 phase and A2 phase and to the B1 phase and B2 phase is inverted, the rotating direction of elliptic vibration generated in the multilayer piezoelectric element 40 can be reversed. This can control the rotating direction of the rotor 13.

In this case, the C-phase and D-phase vibration detection activated areas 113C and 113D as vibration detection phases detect in-phase potentials having the same amplitude in the primary longitudinal vibration mode, and detect opposite-phase potentials having the same amplitude in the second twisting vibration mode.

While primary longitudinal vibration and secondary twisting vibration are simultaneously excited in the multilayer piezoelectric element 40, it is possible to detect only components associated with the secondary twisting vibration, while canceling out components associated with the primary longitudinal vibration, by computing the difference between the potentials detected by the C-phase vibration detection electrode 113C and the D-phase vibration detection electrode 113D of the multilayer piezoelectric element 40.

That is, it is possible to detect only the components associated with the secondary twisting vibration as a vibration detection signal by electrically connecting the external electrode 103C− the external electrode 103D− and extracting the potential difference between the external electrode 103C+ and the external electrode 103D+.

Note that it is also possible to detect only the components associated with the primary longitudinal vibration, while canceling out the components associated with the secondary twisting vibration, by computing the sum of the potentials at the C-phase external electrode 103C and the potential at the D-phase external electrode 103D.

That is, it is possible to detect only the components associated with the primary longitudinal vibration as a vibration detection signal by electrically connecting the external electrode 103C− to the external electrode 103D+ and extracting the potential difference between the external electrode 103C+ and the external 103D−.

The resonance frequency of an ultrasonic transducer changes with changes in temperature or variations in load. For this reason, in order to implement stable driving operation, it is necessary to perform tracking control of driving frequencies. As described above, using signals output from the C and D phases as the vibration detection phases can obtain signals proportional to twisting vibration or primary longitudinal vibration. Controlling (frequency tracking) driving frequencies by referring to the phases or amplitudes of these signals can perform stable driving operation.

As described above, the first embodiment can provide an ultrasonic motor with a simple arrangement. More specifically, the ultrasonic motor according to the first embodiment has the following effects:

It is possible to locate driving activated areas (driving electrode layers) of the multilayer piezoelectric element which contribute to driving operation to positions effective for the excitation of twisting vibration as vibration in the thrusting direction of the motor. It is also possible to provide detection activated areas (vibration detection electrode layers). This can perform frequency tracking based on vibration detection signals without decreasing the motor output, thereby implementing further stable driving operation.

A transducer body used for an ultrasonic transducer can be formed from a piezoelectric element alone. This can simplify the arrangement of the transducer body and the arrangement of the ultrasonic motor. More specifically, since this ultrasonic motor uses a transducer body (multilayer piezoelectric element 40) which has a simple structure because of the use of a single member and need not have any groove portions or the like, it is possible to decrease the number of components and facilitate the manufacture. This can therefore achieve a reduction in cost.

It is possible to secure maximum spaces for accommodating driving activated areas at most suitable positions and also provide vibration detection activated areas. This can implement stable driving operation by frequency tracking without decreasing the motor output.

Second Embodiment

An ultrasonic motor according to the second embodiment will be described below. In order to avoid a redundant description, differences from the ultrasonic motor according to the first embodiment will be described. One of the main differences from the ultrasonic motor according to the first embodiment is the arrangement of the multilayer piezoelectric element 40.

Figure 9:
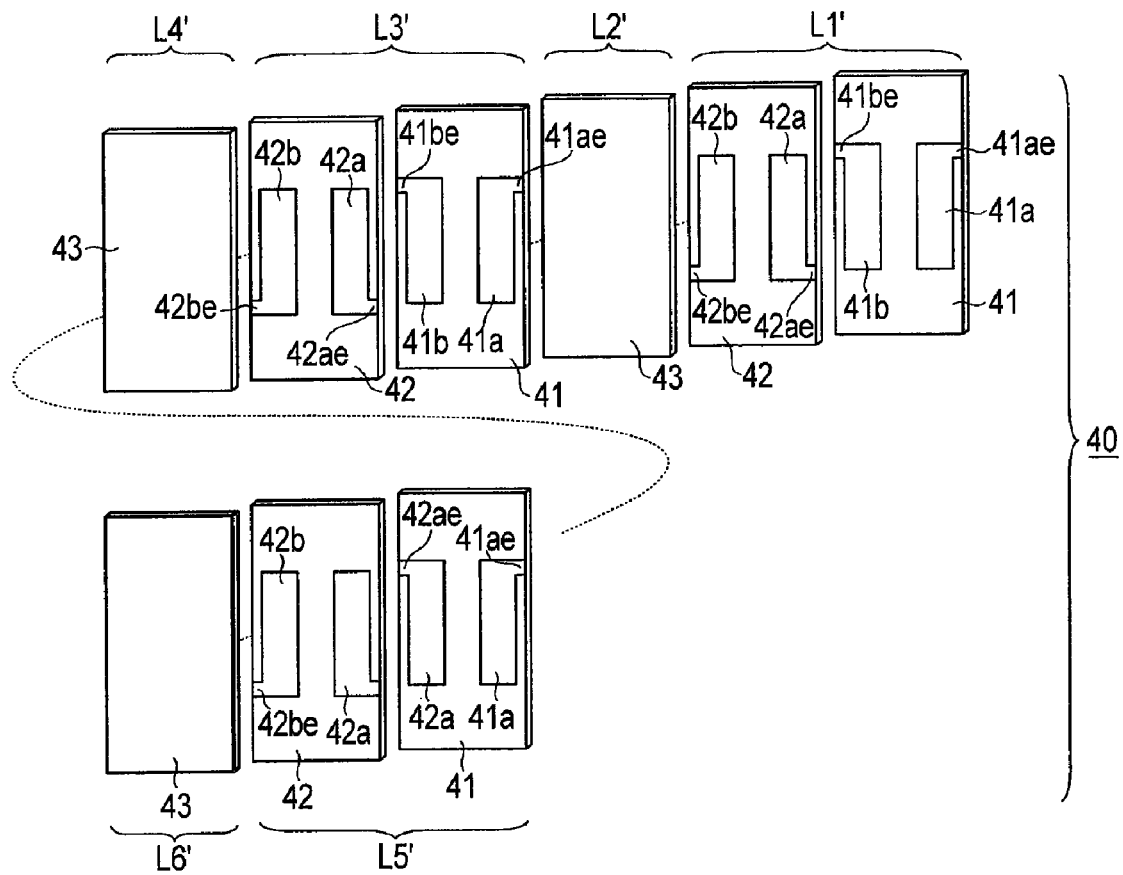
FIG. 9 is a view showing an example of the arrangement of the multilayer piezoelectric element of an ultrasonic motor according to the second embodiment.
Figure 10:
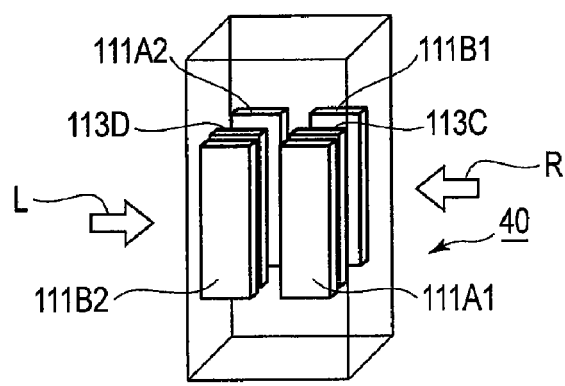
FIG. 10 is a perspective view of the multilayer piezoelectric element of the ultrasonic motor according to the second embodiment when viewed from the front upper side.

FIG. 9 is a view showing an example of the arrangement of a multilayer piezoelectric element 40 of the ultrasonic motor according to the second embodiment. FIG. 10 is a perspective view of the multilayer piezoelectric element 40 of the ultrasonic motor according to the second embodiment when viewed from the front upper side. For the sake of descriptive convenience, FIG. 10 visualizes and shows the driving activated areas and vibration detection activated areas (constituted by the above internal electrodes) existing inside the multilayer piezoelectric element 40, and also shows the respective piezoelectric sheets integrally as the multilayer piezoelectric element 40 instead of discretely showing them.

In the second embodiment, the multilayer piezoelectric element 40 is formed by stacking three types of piezoelectric sheets (a first piezoelectric sheet 41, a second piezoelectric sheet 42, and a third piezoelectric sheet 43) in the following manner.

<<First Multilayer Region L1'>>

A first multilayer region L1' is formed by alternately stacking the plurality of first and second piezoelectric sheets 41 and 42 on each other in the thickness direction.

<<Second Multilayer Region L2'>>

A second multilayer region L2° is formed by stacking at least one third piezoelectric sheet 43 on the first multilayer region L1'. The second multilayer region. L2' includes the center axis 100C of the multilayer piezoelectric element 40.

<<Third Multilayer Region L3'>>

A third multilayer region L3' is formed by alternately stacking the plurality of first and second piezoelectric sheets 41 and 42 on the second multilayer region L2'.

<<Fourth Multilayer Region L4'>>

A fourth multilayer region L4' is formed by stacking at least one third piezoelectric sheet 43 on the third multilayer region L3'.

<<Fifth Multilayer Region L5'>>

A fifth multilayer region L5' is formed by alternately stacking the plurality of first and second piezoelectric sheets 41 and 42 on the fourth multilayer region L4'.

Sixth Multilayer Region L6'>>

A sixth multilayer region L6' is formed by stacking at least one third piezoelectric sheet 43 on the fifth multilayer region L5'.

In an area A of the multilayer piezoelectric element 40, the region formed by stacking internal electrodes 41a and 42a includes a driving activated area (A1 phase) 111A1 and a vibration detection activated area (C phase) 113C.

In an area B of the multilayer piezoelectric element 40, the region formed by stacking the internal electrodes 41a and 42a is a driving activated area (B1 phase) 111B1.

In an area C of the multilayer piezoelectric element 40, the region formed by stacking internal electrodes 41b and 42b includes a driving activated area (B2 phase) 111B2 and a vibration detection activated area (D phase) 113D.

In an area D of the multilayer piezoelectric element 40, the region formed by stacking the internal electrodes 41b and 42b is a driving activated area (A2 phase) 111A2.

More specifically, the positions of the vibration detection activated areas 113C and 113D described above in the multilayer piezoelectric element 40 are located more inwardly than the driving activated areas 111A1, 111A2, 111B1, and 111B2 in the multilayer piezoelectric element 40, and correspond to a node of primary longitudinal vibration and an anti-node of secondary twisting vibration. In the second embodiment, the vibration detection activated areas 113C and 113D are located at positions (positions where they face each other) symmetrical about a plane including a center axis 100C of the multilayer piezoelectric element 40 and perpendicular to the stacking direction of the piezoelectric sheets.

FIG. 11A is a view showing an example of the arrangement of the multilayer piezoelectric element 40 (the right side surface) viewed from the direction indicated by an arrow R in FIG. 10. FIG. 11B is a view showing an example of the arrangement of the multilayer piezoelectric element 40 (the left side surface) viewed from the direction indicated by an arrow L in FIG. 10. The respective internal electrodes described above are short-circuited by external electrodes in the following manner.

<<Area A>>

Exposed portions 41ae of the internal electrodes 41a on the surface layer side of the multilayer piezoelectric element 40, with the fourth multilayer region L4° serving as a boundary, are short-circuited by an external electrode (A1+ phase) 101A1+.

Exposed portions 42ae of the internal electrodes 42a on the surface layer side of the multilayer piezoelectric element 40, with the fourth multilayer region L4° serving as a boundary, are short-circuited by an external electrode (A1− phase) 101A1−.

Exposed portions 41ae of the internal electrodes 41a on the interior side of the multilayer piezoelectric element 40, with the fourth multilayer region L4' serving as a boundary, are short-circuited by an external electrode (C+ phase) 103C+.

Exposed portions 42ae of the internal electrodes 42a on the interior side of the multilayer piezoelectric element 40, with the fourth multilayer region L4' serving as a boundary, are short-circuited by an external electrode (C− phase) 103C−.

<<Area B>>

Exposed portions 41ae of the internal electrodes 41a are short-circuited by an external electrode (B1+ phase) 101B1+.

Exposed portions 42ae of the internal electrodes 42a are short-circuited by an external electrode (B1− phase) 101B1−.

<<Area C>>

Exposed portions 41be of the internal electrodes 41b on the surface layer side of the multilayer piezoelectric element 40, with the fourth multilayer region L4' serving as a boundary, are short-circuited by an external electrode (B2+ phase) 101B2+.

Exposed portions 42be of the internal electrodes 42b on the surface layer side of the multilayer piezoelectric element 40, with the fourth multilayer region L4° serving as a boundary, are short-circuited by an external electrode (B2− phase) 101B2−.

Exposed portions 41be of the internal electrodes 41b on the interior side of the multilayer piezoelectric element 40, with the fourth multilayer region L4' serving as a boundary, are short-circuited by an external electrode (D+ phase) 103D+.

Exposed portions 41be of the internal electrodes 41b on the interior side of the multilayer piezoelectric element 40, with the fourth multilayer region L4' serving as a boundary, are short-circuited by an external electrode (D− phase) 103D−.

<<Area D>>

Exposed portions 41be of the internal electrodes 41b are short-circuited by an external electrode (A2+ phase) 101A2+.

Exposed portions 42be of the internal electrodes 42b are short-circuited by an external electrode (A2− phase) 101A2−.

As described above, the second embodiment can provide an ultrasonic motor which has the same effects as those of the ultrasonic motor according to the first embodiment, and also has the following effects. That is, since the multilayer piezoelectric element 40 can be constituted by three types of piezoelectric sheets, the manufacturability improves.

Third Embodiment

An ultrasonic motor according to the third embodiment will be described below. In order to avoid a redundant description, differences from the ultrasonic motor according to the first embodiment will be described. One of the main differences from the ultrasonic motor according to the first embodiment is the arrangement of the multilayer piezoelectric element 40. The ultrasonic motor according to the third embodiment is an ultrasonic motor which performs vibration detection to detect only components associated with primary longitudinal vibration.

Figure 12:
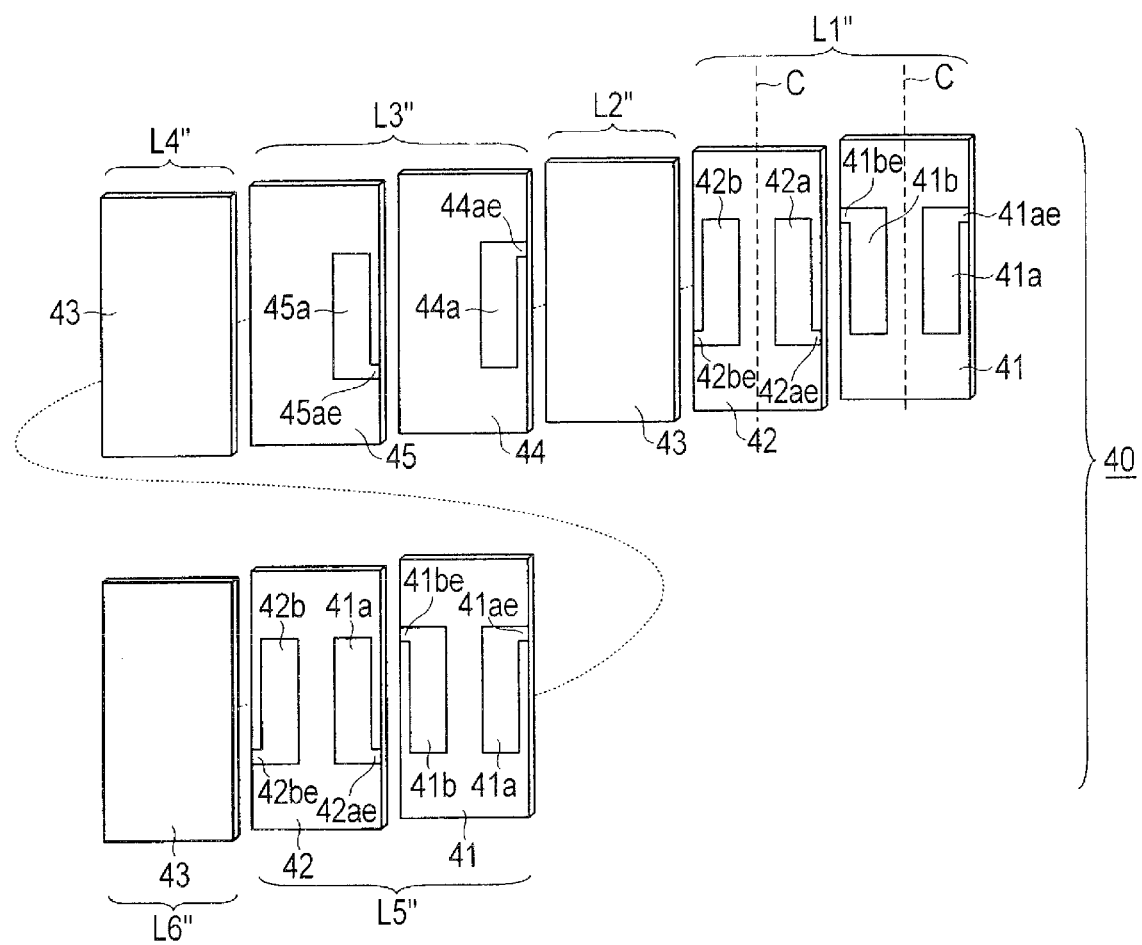
FIG. 12 is a view showing an example of the arrangement of the multilayer piezoelectric element of an ultrasonic motor according to the third embodiment.

FIG. 12 is a view showing an example of the arrangement of the multilayer piezoelectric element 40 according to the third embodiment. The multilayer piezoelectric element 40 according to the third embodiment is formed by stacking five types of piezoelectric sheets (a first piezoelectric sheet 41, a second piezoelectric sheet 42, a third piezoelectric sheet 43, a fourth piezoelectric sheet 44, and a fifth piezoelectric sheet 45) in the following manner.

<<First Multilayer Region L1">>

A first multilayer region L1" is formed by alternately stacking the plurality of first and second piezoelectric sheets 41 and 42 on each other in the thickness direction.

<<Second Multilayer Region L2">>

A second multilayer region L2" is formed by stacking at least one third piezoelectric sheet 43 on the first multilayer region L1".

<<Third Multilayer Region L3">>

A third multilayer region L3" is formed by alternately stacking the plurality of fourth and fifth piezoelectric sheets 44 and 45 on the second multilayer region L2". The third multilayer region L3" includes the center axis 100C of the multilayer piezoelectric element 40.

<<Fourth Multilayer Region L4">>

A fourth multilayer region L4" is formed by stacking at least one third piezoelectric sheet 43 on the third multilayer region L3".

<<Fifth Multilayer Region L5">>

A fifth multilayer region L5" is formed by alternately stacking the plurality of first and second piezoelectric sheets 41 and 42 on the fourth multilayer region L4".

<<Sixth Multilayer Region L6">>

A sixth multilayer region L6" is formed by stacking at least one third piezoelectric sheet 43 on the fifth multilayer region L5".

FIG. 13 is a perspective view showing the multilayer piezoelectric element 40 of the ultrasonic motor according to the third embodiment when viewed from the front upper side. For the sake of descriptive convenience, FIG. 13 visualizes and shows the driving activated areas and vibration detection activated areas (formed by the above internal electrodes) existing in the multilayer piezoelectric element 40, and also shows the respective piezoelectric sheets integrally as the multilayer piezoelectric element 40 instead of discretely showing them.

In an area A of the multilayer piezoelectric element 40, the region formed by stacking internal electrodes 41a and 42a is a driving activated area (A1 phase) 111A1.

In an area B of the multilayer piezoelectric element 40, the region formed by stacking internal electrodes 41a and 42a is a driving activated area (B1 phase) 111B1.

In an area extending to both the areas A and B of the multilayer piezoelectric element 40 while including the interface between the areas A and B (which is a plane located at an intermediate portion of the multilayer piezoelectric element 40 in the stacking direction and including the center axis 100C), the region formed by stacking internal electrodes 44a and 45a is a vibration detection activated area (C' phase) 113C'.

In an area C of the multilayer piezoelectric element 40, the region formed by stacking internal electrodes 41b and 42b is a driving activated area (B2 phase) 111B2.

In an area D of the multilayer piezoelectric element 40, the region formed by stacking internal electrodes 41b and 42b is a driving activated area (A2 phase) 111A2.

More specifically, the vibration detection electrode 113C' described above is shaped and placed so as to be symmetrical about an intermediate portion of the multilayer piezoelectric element 40 in the stacking direction (i.e., a piezoelectric sheet including the center axis 100C). This arrangement allows to detect only components associated with primary longitudinal vibration while canceling out components associated with secondary twisting vibration, when detecting vibration by using the vibration detection electrode 113C'.

In the above case, the vibration detection electrode layer (vibration detection activated area 113C') is shaped and placed so as to be symmetrical about the piezoelectric sheet including the center axis 100C. However, the vibration detection electrode layer (vibration detection activated area 113C') may be shaped and placed so as to be symmetrical about a plane perpendicular to each piezoelectric sheet including the center axis 100G. Alternatively, the vibration detection electrode layer (the vibration detection activated area 113C') may be shaped and positioned so as to be symmetrical about both a piezoelectric sheet including the center axis 100C and a plane perpendicular to each piezoelectric sheet including the center axis 100C.

FIG. 14A is a view showing an example of the arrangement of the multilayer piezoelectric element 40 (the right side surface) viewed from the direction indicated by an arrow R in FIG. 13. FIG. 14B is a view showing an example of the arrangement of the multilayer piezoelectric element 40 (the left side surface) viewed from the direction indicated by an arrow L in FIG. 13.

The respective internal electrodes described above are short-circuited by external electrodes in the following manner.

<<Area A>>
Exposed portions 41ae of the internal electrodes 41a on the surface layer side of the multilayer piezoelectric element 40, with the fourth multilayer region L4' serving as a boundary, are short-circuited by an external electrode (A1+ phase) 101A1+.

Exposed portions 42ae of the internal electrodes 42a on the surface layer side of the multilayer piezoelectric element 40, with the fourth multilayer region L4° serving as a boundary, are short-circuited by an external electrode (A1− phase) 101A1−.

<<Area B>>
Exposed portions 41ae of the internal electrodes 41a are short-circuited by an external electrode (B1+ phase) 101B1+.

Exposed portions 42ae of the internal electrodes 42a are short-circuited by an external electrode (B1− phase) 101B1−.

<<Area Including Interface between Area A and Area B and Extending to Them>>
Exposed portions 44ae of the internal electrodes 44a are short-circuited by an external electrode (C'+ phase) 103C'+.

The exposed portions 44ae of the internal electrodes 44a are short-circuited by an external electrode (C'− phase) 103C'−.

<<Area C>>
Exposed portions 41ae of the internal electrodes 41b on the surface layer side of the multilayer piezoelectric element 40, with the fourth multilayer region L4' serving as a boundary, are short-circuited by an external electrode (B2+ phase) 101B2+.

Exposed portions 42be of the internal electrodes 42b on the surface layer side of the multilayer piezoelectric element 40, with the fourth multilayer region L4' serving as a boundary, are short-circuited by an external electrode (B2− phase) 101B2−.

<<Area D>>
Exposed portions 41be of the internal electrodes 41b are short-circuited by an external electrode (A2+ phase) 101A2+.

Exposed portions 42be of the internal electrodes 42b are short-circuited by an external electrode (A2− phase) 101A2−.

As described above, the third embodiment can provide an ultrasonic motor which has the same effects as those of the ultrasonic motor according to the first embodiment, and also has the following effects. That is, since the number of external electrodes can be reduced, this arrangement is more effective in reducing the size of the device.

Note that each embodiment described above has exemplified the driving system of exciting primary longitudinal vibration and secondary twisting vibration in the multilayer piezoelectric element 40. Obviously, however, each embodiment described above can be applied to a device using the driving system of exciting primary longitudinal vibration and tertiary twisting vibration.

The above embodiments include inventions of various stages, and various inventions can be extracted by proper combinations of a plurality of disclosed constituent elements. When, for example, the problem described in "Description of the Related Art" can be solved and the effects described in "BRIEF SUMMARY OF THE INVENTION" can be obtained even if several constituent elements are omitted from all the constituent elements in each embodiment, the arrangement from which these constituent elements are omitted can be extracted as an invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic motor comprising:

a transducer in which a ratio between lengths of a short side and long side, constituting a section perpendicular to a center axis of the transducer having a substantially rectangular shape, is set to a ratio which makes a resonance frequency of longitudinal vibration of the transducer stretching and contracting in the center axis direction substantially coincide with a resonance frequency of twisting vibration about the center axis as a twisting axis, the longitudinal vibration and the twisting vibration are simultaneously excited, and elliptic vibration obtained by combining the vibrations is excited;

a driven member which is pressed against an elliptic vibration generation surface, of the transducer, in which the elliptic vibration is excited, and is driven to rotate about the center axis as a rotation axis by the elliptic vibration; and a pressing mechanism unit which presses the transducer against the driven member to press the elliptic vibration generation surface of the transducer against the driven member, wherein the transducer includes a plurality of stacked piezoelectric sheets on which internal electrodes are formed, the internal electrodes form a plurality of driving activated areas and a plurality of vibration detection activated areas in the transducer, the plurality of driving activated areas are located in portions, of the transducer, which correspond to a node of the longitudinal vibration and an anti-node of twisting vibration, so as to be symmetrical about a central plane in the stacking direction and a plane which is perpendicular to the stacking direction and includes the center axis, and are polarized in the stacking direction, and the plurality of vibration detection activated areas are located in portions, of the transducer, which correspond to a node of the longitudinal vibration and an anti-node of the twisting vibration and are closer to the central plane than the driving activated areas, and are polarized in the stacking direction.

2. The motor according to claim 1, wherein the plurality of vibration detection activated areas are located to be symmetrical about a plane which includes the center axis and is horizontal to the stacking direction of the piezoelectric sheets.

3. The motor according to claim 1, wherein the plurality of vibration detection activated areas are located to be symmetrical about a plane which includes the center axis and is vertical to the stacking direction of the piezoelectric sheets.

4. The motor according to claim 1, wherein the plurality of vibration detection activated areas are located to be symmetrical about a plane which includes the center axis and is horizontal to the stacking direction of the piezoelectric sheets and/or symmetrical about a plane which includes the center axis and is vertical to the stacking direction of the piezoelectric sheets.

* * * * *